United States Patent [19]

Darbo et al.

[11] Patent Number: 4,991,818

[45] Date of Patent: Feb. 12, 1991

[54] SYSTEM FOR RAPID MOUNTING AND REMOVAL OF A CARRIER ON AND FROM A SUPPORT FRAME

[75] Inventors: Benoit Darbo, Cauderan; Patrice Lacroix, St. Aubin De Medoc, both of France

[73] Assignee: Thomson CSF, Paris, France

[21] Appl. No.: 293,836

[22] Filed: Jan. 5, 1989

[30] Foreign Application Priority Data

Jan. 8, 1988 [FR] France .............................. 88 00137

[51] Int. Cl.⁵ .......................................... F16M 13/00
[52] U.S. Cl. .............................. 248/681; 292/DIG. 30
[58] Field of Search ............. 248/1 R, 1 A, 544, 551, 248/680, 681, 27.3, 221.3, 500; 292/DIG. 30, 259, 116, 120; 312/7.2, 244, 311

[56] References Cited

U.S. PATENT DOCUMENTS

| | | | |
|---|---|---|---|
| 1,064,005 | 6/1913 | Pritzl | 248/681 |
| 3,035,859 | 5/1962 | Rimmer | 292/DIG. 30 |
| 3,039,837 | 6/1962 | Poe | 292/DIG. 30 |
| 3,120,412 | 2/1964 | Caldwell . | |
| 3,284,151 | 11/1966 | Morrison | 312/244 |
| 3,711,175 | 1/1973 | Sottsass, Jr. | 312/244 |

FOREIGN PATENT DOCUMENTS

| | | | |
|---|---|---|---|
| 1025210 | 4/1953 | France | 248/681 |
| 926768 | 5/1963 | United Kingdom . | |

Primary Examiner—David M. Purol
Assistant Examiner—Robert A. Olson
Attorney, Agent, or Firm—Cushman, Darby & Cushman

[57] ABSTRACT

The system for rapid mounting and removal of a carrier on and from a support frame comprises a handle which is accessible at the front of the carrier and the ends of which are joined to two side arms pivotally mounted on two shafts. The handle is locked in the top position by means of a blade-spring device. Two studs come into position within notched portions of the arms. Each stud is attached to a spring, the other end of which is attached to the support frame. The springs are stretched in order to bring the studs into an initial stop position. After mounting of the carrier, higher tension is exerted and has the effect of locking the carrier position.

7 Claims, 6 Drawing Sheets

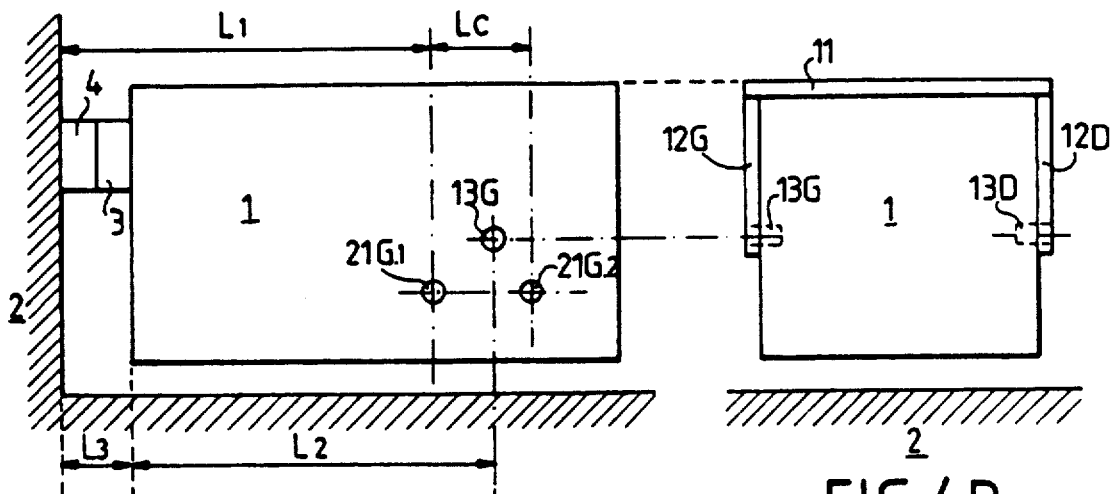
FIG.4A  FIG.4B
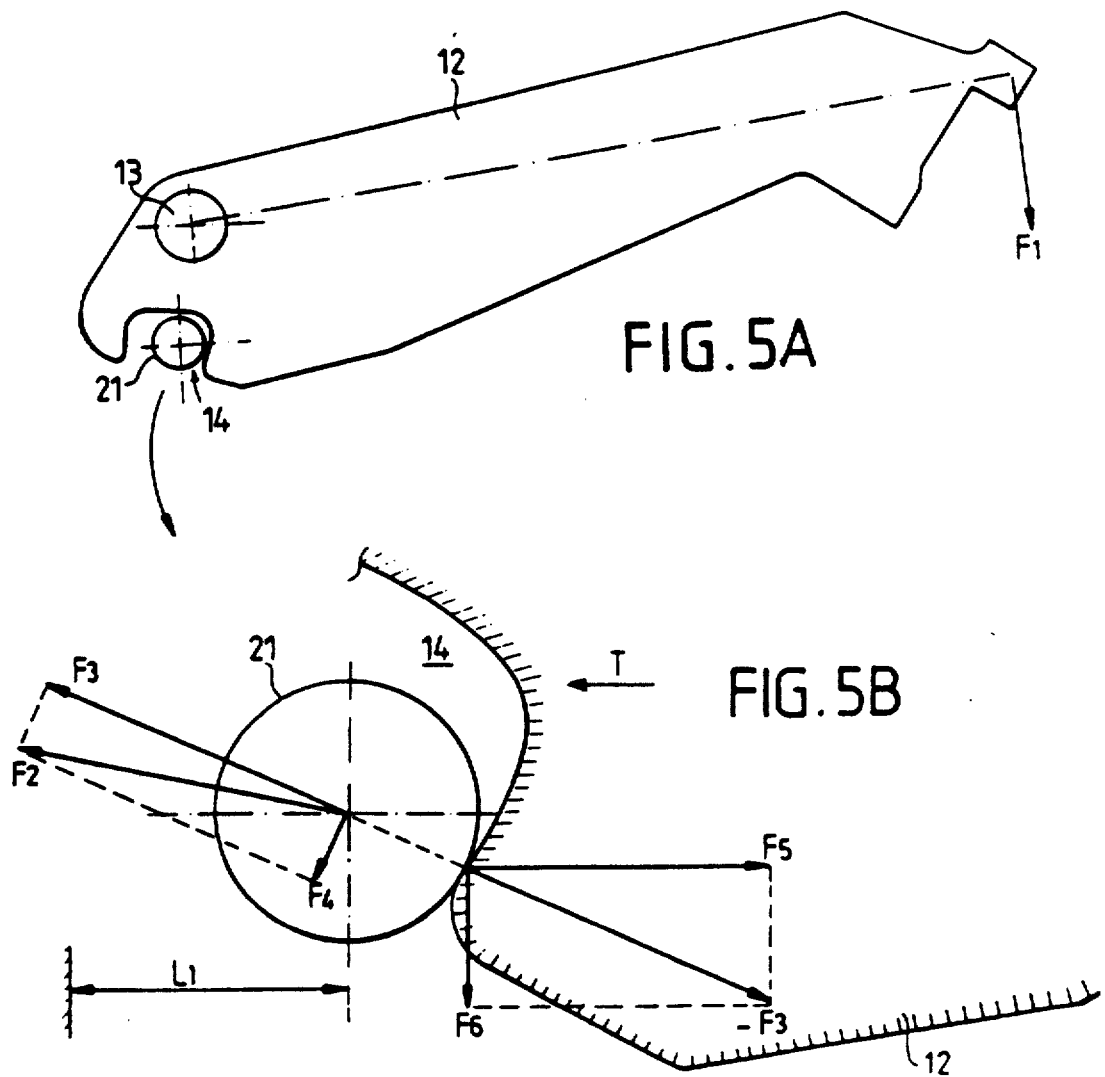
FIG.5A
FIG.5B

SYSTEM FOR RAPID MOUNTING AND REMOVAL OF A CARRIER ON AND FROM A SUPPORT FRAME

BACKGROUND OF THE INVENTION

1. Field of the Invention

The present invention relates to a system for mounting and removal of a carrier on and from a support frame.

The invention advantageously applies to electrical carriers since connector engagement (and connector disengagement) can be produced simultaneously during the mounting operation (and removal operation). Furthermore, viewing of a dial or of a cathode-ray tube (CRT) display or the like on the front face of the carrier is preserved by virtue of the fact that the mounting system is practically unhindered by any mask effect.

2. Description of the Prior Art

It is known to position a carrier of the type used for car radios, for example, by sliding it within a parallelepipedal casing provided with a coupling connector corresponding to the connector provided on the carrier. The carrier unit constituted by the radio set is of low weight and so arranged as to be downwardly inclined. When the vehicle is in use, the carrier is maintained in position without any particular problem.

The problem is different in the case of much heavier carrier units such as, for example, CRT displays which are mounted in a horizontal or substantially horizontal position and the operation of which can take place in any other position as a function of the motion of the transporting vehicle, particularly if this latter is an aircraft. Furthermore, it is necessary to take into account the severe environmental conditions, in particular vibrations, thermal conditions or the like which have to be withstood by equipment of this type.

SUMMARY OF THE INVENTION

The mounting system proposed makes it possible to solve these problems with a high degree of reliability and very great simplicity of operation by means of simple manual controls which do not require any tools but make it possible at the same time to carry out locking with engagement of the connectors and unlocking with disengagement of the connectors.

In accordance with the invention, it is propose to construct a system for rapid mounting and removal of a carrier on and from a support frame by horizontal translational displacement of the carrier, comprising:

a handle which is accessible at the front of the carrier, the ends of the handle being joined to two arms disposed respectively on the left side and right side of the carrier and pivoted respectively on two shafts rigidly fixed to the carrier, each arm being provided with a notched portion;

a device for locking the handle in the top position;

two studs positioned respectively within the notched portions of the arms, each stud being mounted on a member which is capable of displacement in the direction of translational motion of the carrier and which is coupled mechanically to a spring secured to the frame, said spring being stretched so as to exert a tractive force in said direction, in the direction of mounting of the carrier;

a mechanical stop device for limiting the travel of each stud-supporting member in the direction of mounting of the carrier, the resultant tractive force of the two springs in the stop position of the two members being of higher value than is necessary for displacing the carrier in said translational motion.

BRIEF DESCRIPTION OF THE DRAWINGS

FIGS. 4A and 4B are simplified diagrams representing respectively the principal dimensions which serve to determine the mounting and removal system and the minimum mask provided on the front face. FIGS. 5A and 5B are diagrams of a lateral arm showing the engagement of the stud in the notched portion with a detail of this portion.

DESCRIPTION OF A PREFERRED EMBODIMENT

Figure 1:
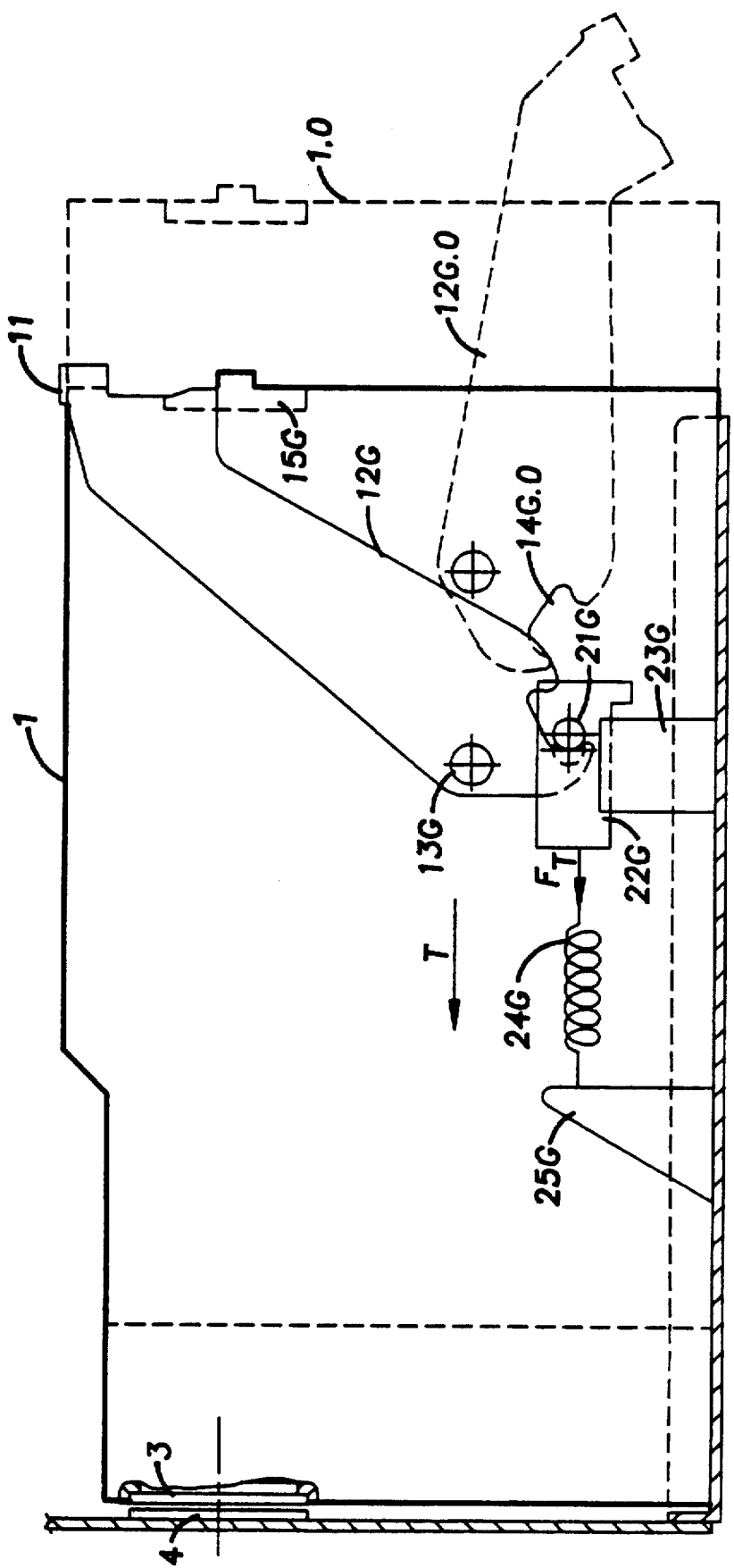
FIG. 1 is a diagram of a system for mounting and removal in accordance with the invention showing the carrier placed within, the support casing and the various elements of the system.

Referring to FIG. 1, there can be seen a carrier 1 which is intended to be placed in position on a support frame 2 (shown in cross-hatching lines). Mounting of the carrier is carried out by displacement in horizontal translation in the direction T. Removal of the carrier is carried out by horizontal displacement in the opposite direction. Without implying any limitation of the invention, consideration has been given in the embodiment shown to a carrier provided with an end connector 3 on the rear face and to a frame having a corresponding coupling connector 4. By pushing the carrier sufficiently far home, engagement of the connection elements 3 and 4 thus takes place.

The system of mounting and removal comprises a handle 11 which is joined to two arms and swings back in the top position against the front face of the carrier. Although it does not form part of the frame equipment, said handle has been added in FIG. 2 in order to show its cooperation by means of the two side arms, namely the left arm 12G and the right arm 12D with the other elements carried by the frame 2. By virtue of its dimensions, the handle produces practically no mask effect on the front face as can clearly be seen in FIG. 3 or in FIG. 4B. The arms 12G and 12D are rotatably mounted respectively on two shafts 13G and 13D which are rigidly fixed to the carrier 1 and each arm has a notched portion 14G and 14D. The handle and the arms are maintained locked in the top position by means of a device which can be constituted as shown by two springs 15G and 15D. Each spring is formed by a blade which is flattened under the action of pressure of the arms when the handle is moved to the top position and has a boss 16G and 16D on which is applied respectively a bottom surface of the associated arm, thus maintaining it locked in the top position. For the unlocking operation, it is only necessary to exert pressure simultaneously on the bosses 16G and 16D in order to release the arms again and thus to permit a downward movement of the handle 11.

The notched portions of the arms are each intended to receive respectively a stud 21G and 21D. Each stud is mounted on a member 22G and 22D which can be displaced in the direction T at the time of withdrawl or in the opposite direction at the time of mounting. The displacement in the direction T of mounting is limited by a stop which can consist simply of a specially shaped machined portion of the support member 22G and 22D so that it can be applied against an associated member which is rigidly fixed to the frame 2. As shown in the drawings, this member can be respectively the member 23G and 23D which serves to guide the elements 22G and 22D. Each member 22G and 22D is coupled mechanically to one end of a spring 24G and 24D, the other end of which is attached to the frame 2 directly or by means of a member 25G and 25D.

In FIG. 1, the carrier 10 is shown in dashed outline at the beginning of its introduction by sliding displacement on the support frame 2, the arms being in an initial bottom position 12G.0 which enables the associated stud 21G to pass into the corresponding notch 14G.0. The representation in full lines corresponds to complete insertion, the handle 11 being in the raised position and locked in this top position by means of the springs 15G and 15D.

Figure 2:
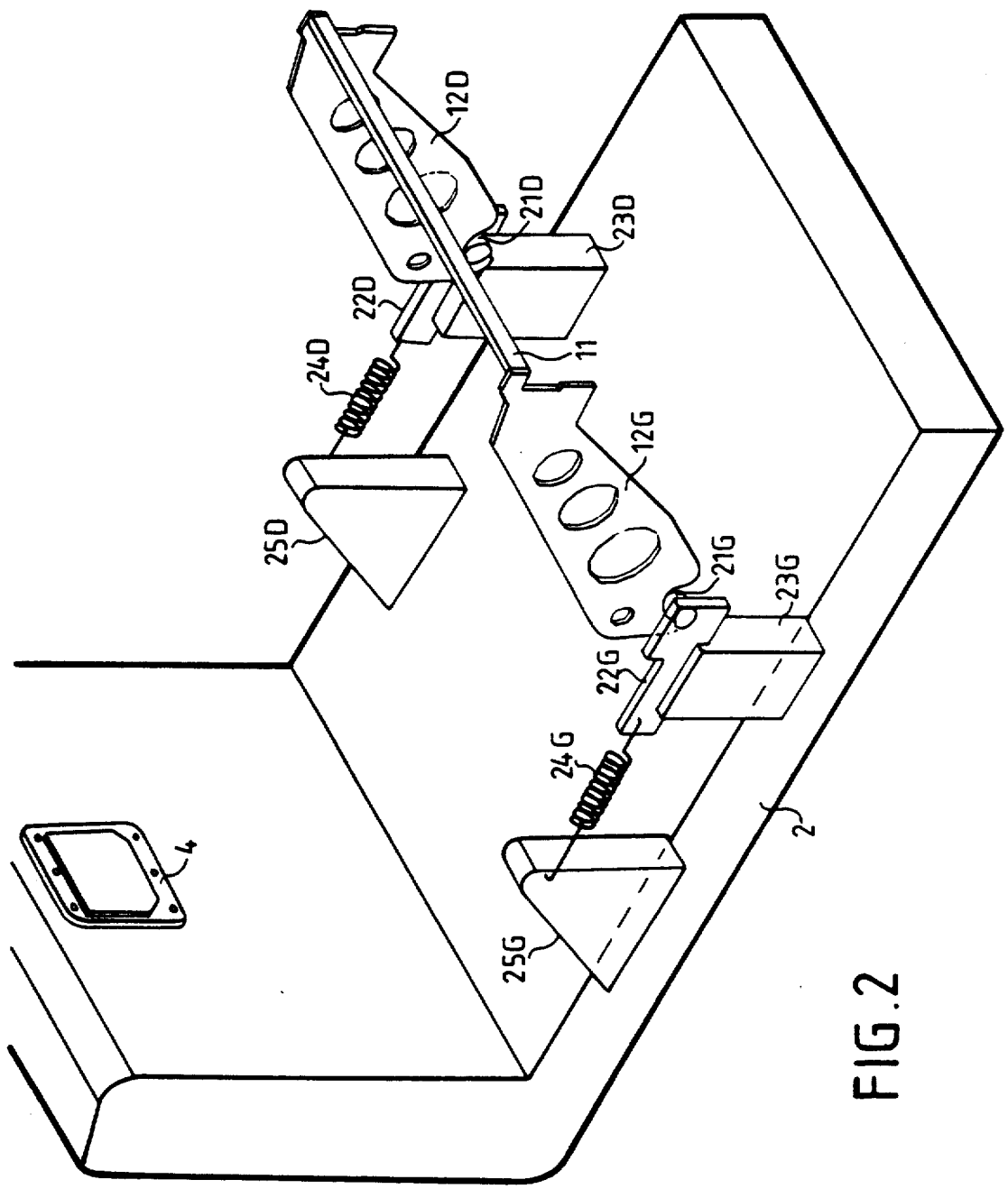
FIG. 2 is a diagram of the support frame equipped with the mounting and removal system in accordance with FIG. 1.

FIG. 2 shows more particularly the support frame 2 with the mounting equipments 21 to 25 to which the handle 11 and its arms 12D and 12G are added in order to gain a clearer understanding.

Figure 3:
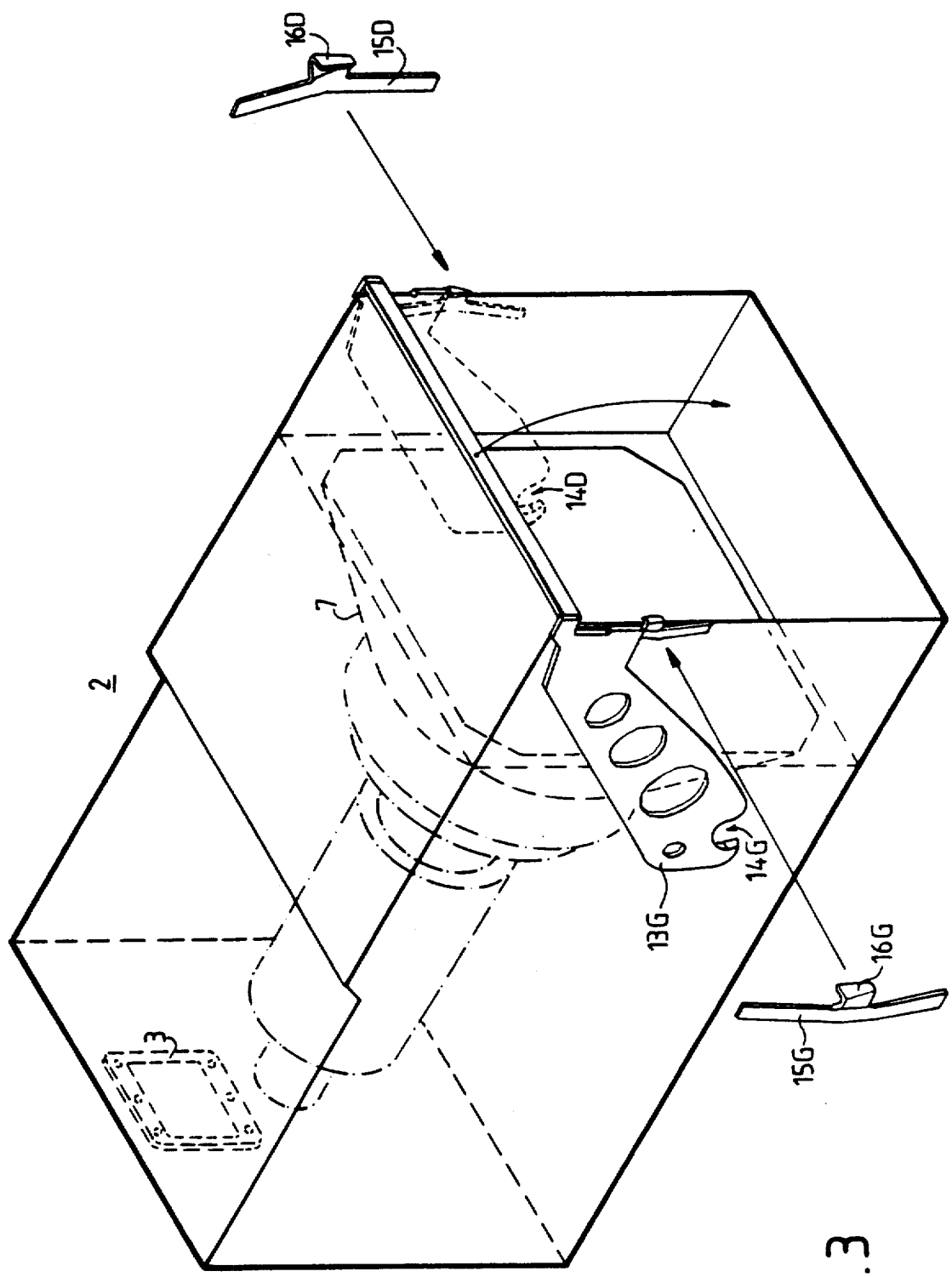
FIG. 3 is a diagram of the carrier equipped with the mounting and removal system of FIG. 1.

FIG. 3 shows a carrier 2 which, in accordance with a more particular application which is contemplated, comprises a display CRT 7. In this figure, the lateral springs 15D and 15G for locking the arms in the top position are set aside and illustrated in detail so as to show the abutment surfaces 16G and 16D on which the arms are intended to rest.

FIG. 4A indicates the essential dimensions respected by the assembly, namely the fixed distance L2 between the axis of rotation 13 of the arms and the end-wall of the carrier, the dimension L3 between the end-wall of the carrier and the frame, that is, the thickness of the engaged connector device 3-4 comprised between these two planes. The dimension L1 represents the distance between the frame 2 and the stud 21G1 when this latter is in the stop position (position of abutment) and LC is the distance of travel of the stud in order to bring this latter to the work position 21G2 at the end of assembly when the arms are locked in the top position. These elements are taken into account in order to determine in particular, when the studs are in the work position 21G2 and 21D2, a terminal tractive force of the springs 24G and 24D which is compatible with the specifications of the manufacturer of connectors, that is, lower in value than the maximum pressure force which the connector elements 3 and 4 are capable of withstanding. Furthermore, as stated earlier, the assembly is so determined that the initial tractive force of the spring in the position 21G1 and 21D1 of abutment of the studs is higher than the force required for translational displacement of the carrier and engagement of its connector.

FIG. 4B represents schematically the front face of the carrier and shows that this latter is practically fully withdrawn by means of a handle 11 of small width which, in the top position, will usually be in a naturally concealed location and outside the display screen or the useful display zone.

FIG. 5A and the detail 5B represent in particular the shape of the notched portion 14 of the arm 12 (left or right arm). The arm 12 is shown in the position of carrier removal of FIG. 7 in which the front surface of the notched portion bears on the stud which is in the stop position. In this position, the operator exerts on the handle 11 a downward force F1 which is represented at the level of the stud 21 by a force F3 and an opposite reaction -F3 on the same side as the arm. This reaction force -F3 is oriented downwards and can be resolved into F5 which is parallel to the horizontal direction of displacement T but of opposite direction and F6 which is perpendicular to T. It is apparent that the vertical component F6 is directed downwards and thus tends to apply the carrier 1 on the frame 2. On the other hand, the component F5 tends to produce withdrawal of the carrier 1 and disengagement of the connector.

Figure 6:
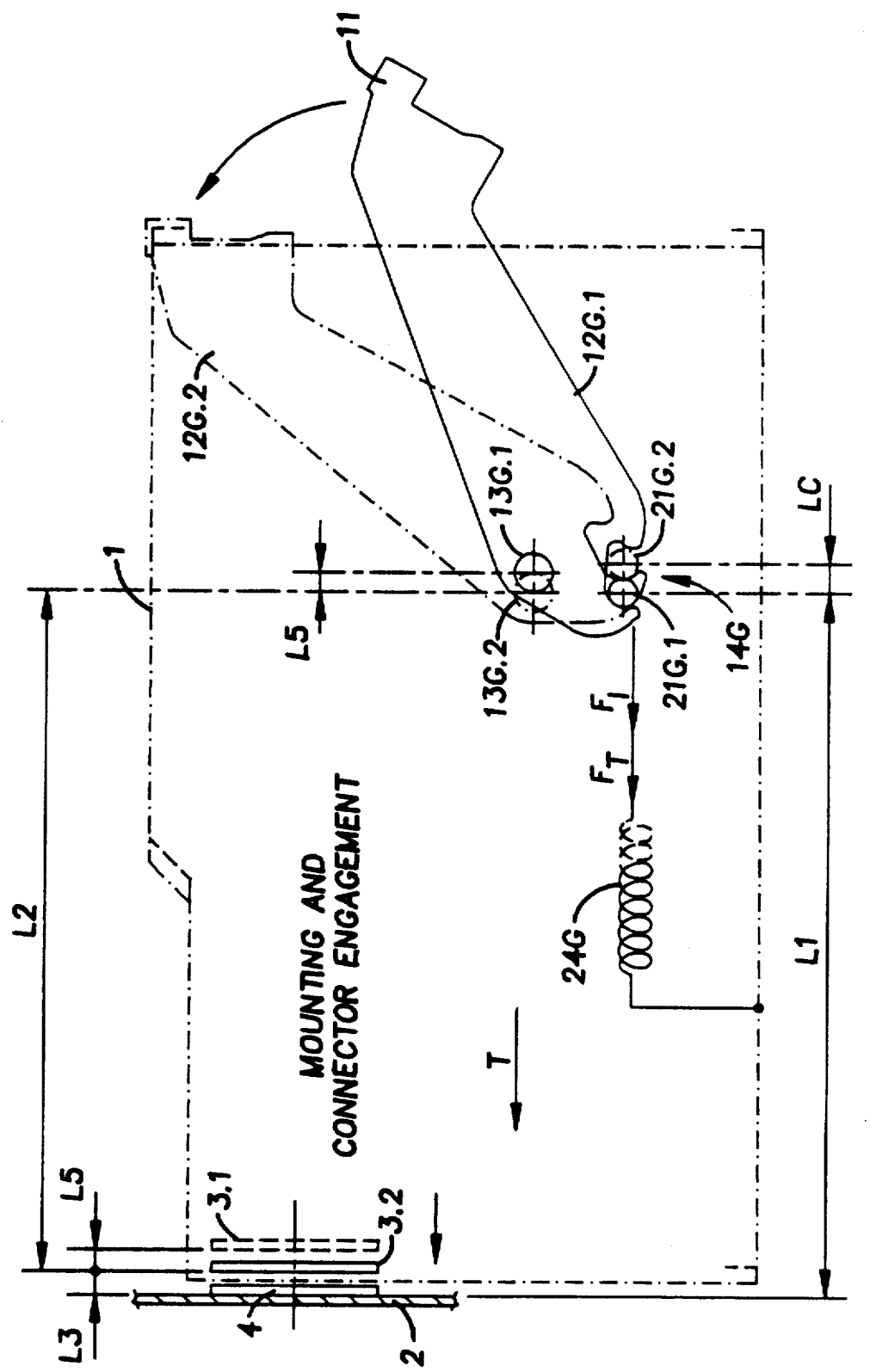
FIG. 6 is a simplified diagram of the assembly in accordance with FIG. 1 when carrying out connector engagement and mounting of the carrier.

The same applies at the time of the mounting operation (see FIG. 6). By lifting the handle 12, the stud 21 is brought to bear on the rear surface of the notched portion 14. The corresponding reaction force will have a horizontal component parallel to T and having the same direction which is therefore favorable to positioning of the carrier 1 and to connector engagement, and a vertical component of said reaction force which is directed downwards in the same manner as F6 mentioned earlier, and which applies the carrier 1 on the frame 2.

FIG. 6 illustrates the mounting and connector-engagement operation. The carrier 1 is first pushed by the operator towards the end-wall of the frame 2 with the arms in the bottom position (12G.0 in FIG. 1) so as to engage them on the studs. This movement of horizontal translation is stopped after a contact has been made between the connectors 3 and 4. In order to engage the connectors and to lock the carrier in position, the operator lifts the handle 11 so as to engage the notches 14G and 14D on the studs 21G.1 and 21D.1 in the stop position. The operator continues the upward movement of the handle 11 with rotation of the arms about the axes 13G and 13D in order to displace the arms from the position 12G.1 and 12D.1 to the top position 12G.2 and 12D.2. The lever constituted by the portion between the axis of rotation at 13 and the handle 11 exerts a thrust at the level of the studs 21G.1 and 21D.1 which makes it possible to displace these studs from the stop position 21G.1 and 21D.1 to the work position 21G.2 and 21D.2 over a range of travel LC, at the end of which each spring 24G and 24D produces a higher tractive force which increases from the initial value FI to the final value FT. During this same stage, the axis 13 has moved over a distance L5 in the direction T and this distance corresponds to full engagement of the connectors 3-4. The initial resultant force 2FI which arises from the tension of the two springs 24G and 24D is higher than the force which is necessary for horizontal translational displacement of the carrier. The resultant 2FT in the work position of the studs is so determined as to be lower than the value of maximum pressure recommended for the connectors. This resultant 2FT and the upward return of the arms to the top position ensure that the carrier is held in position in spite of exacting conditions of use, especially from the point of view of mechanical vibrations.

Figure 7:
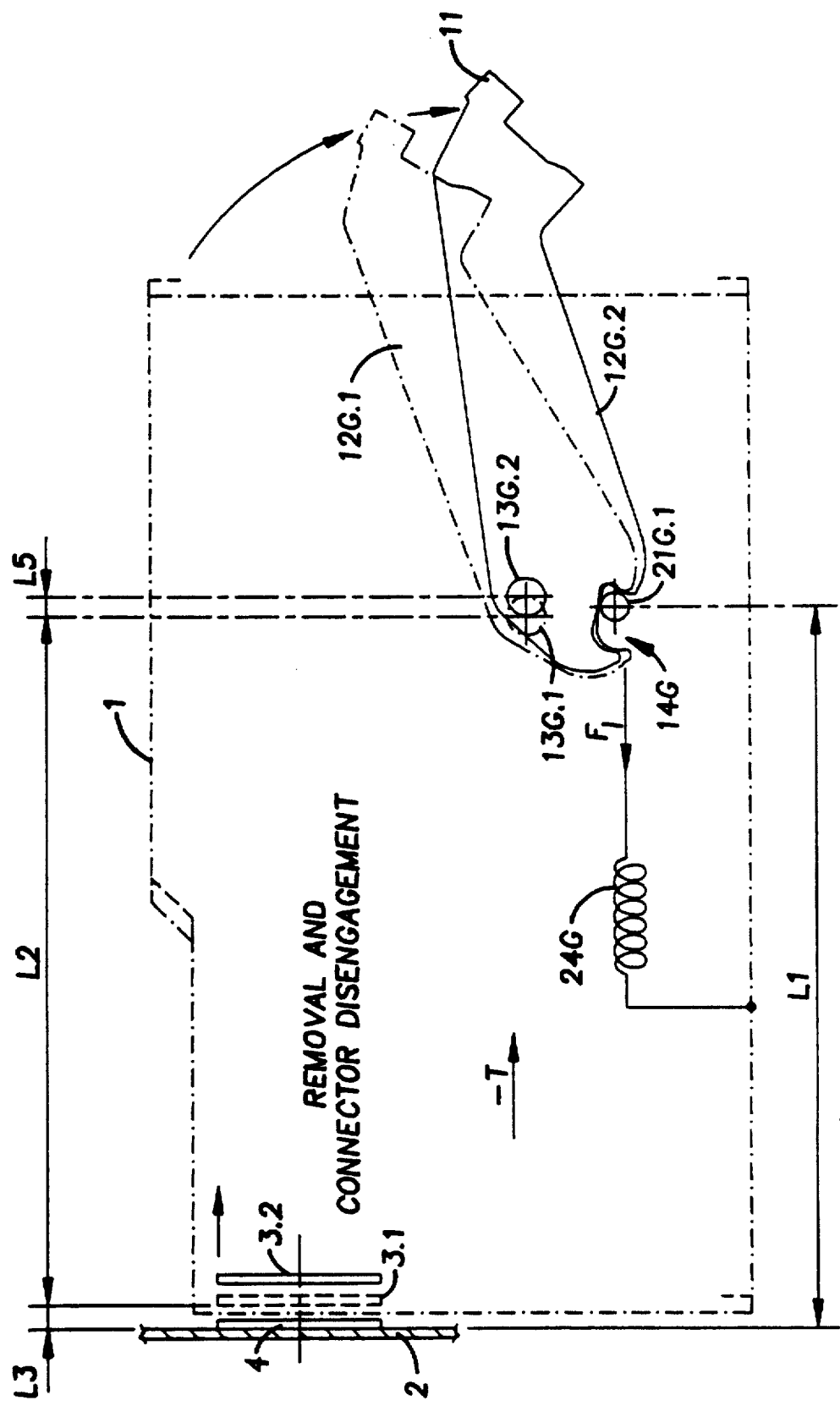
FIG. 7 is a simplified diagram of the assembly in accordance with FIG. 1 when carrying out connector disengagement and removal of the carrier.

FIG. 7 relates to the removal and connector-disengagement operation. By applying pressure on the lateral portions 16D and 16G of the springs, the arms are released and, under the influence of the force 2FT, the assembly 11-12 undergoes a pivotal displacement so as to come into the position 12G1 of application against the stud 21 which has returned to its stop position 21G.1. At this instant, the connectors are engaged in the initial position 4-3.1. By exerting a downward force on the handle 11, the arm is moved to the position 12G.2. Since the studs are in the stop position 21G.1 and 21D.1, their position does not change. On the other hand, the axis 13 is displaced over a sufficient distance L5 in the forward direction −T opposite to that of mounting to ensure that the connector 3 comes into the position 3.2 in which it is disengaged from the connector 4. It is then only necessary to cause the carrier 1 to slide outwards in order to withdraw it completely from the support frame 2, the arms fall to the bottom position progressively under the action of their weight and do not catch on the studs in their notched portion 14.

What is claimed is:

1. A system for rapid mounting and removal of a carrier on and from a support frame by horizontal translational displacement of the carrier, comprising:
    a handle which is accessible at the front of the carrier, the ends of the handle being joined to two arms disposed respectively on the left side and right side of the carrier and pivoted between a top and a down position respectively on two shafts rigidly fixed to the carrier, each arm being provided with a notched portion;
    a locking device for locking the handle when the arms are in the top position;
    two studs positioned respectively within the notched portions of the arms when the carrier is pushed in the support frame, each stud being mounted on a member which is capable of displacement in the directions of translational motion for mounting and removal of the carrier and which is coupled mechanically to a spring secured to the frame, said spring being stretched so as to exert a tractive force in the direction of mounting of the carrier, the arms being mounted to displace the studs when the arms are moved to the top position, thereby increasing the stretching of the springs;
    a mechanical stop device for limiting to a stop position the travel of each stud-supporting member in the direction of mounting of the carrier, the resultant of the tractive forces of the two springs in the stop position being of higher value than is necessary for displacing the carrier in said translational motion.

2. A system according to claim 1, wherein the carrier and the frame are equipped with electrical connectors with engagement at the time of mounting in said movement of translation and disengagement at the time of removal in a reverse movement, and wherein the resultant of the tractive forces of the springs after mounting and locking of the carrier is lower than the maximum value permitted by the connectors.

3. A system according to claim 1, wherein the handle in the top position does not produce any mask effect for observation of data on the front face of the carrier.

4. A system according to claim 3, wherein the carrier is equipped with a cathode-ray tube.

5. A system according to claim 1, wherein
    each notched portion is provided with a rear flank on which the stud is applied at the time of mounting and with a front flank on which the stud is applied at the time of removal.

6. A system according to claim 5, wherein the unlocked handle is restored by the force of the springs to a first intermediate low position in which the studs come into the stop position, said first intermediate low position being such as to correspond to application of the stud on the front flank formed on the notched portion of the associated arm.

7. A system according to claim 5, wherein the device for locking the handle is constituted by two spring blades with a bearing boss for ensuring automatic locking of the handle at the time of mounting of the carrier, unlocking being produced by manual pressure on said bosses.

* * * * *